United States Patent
Hoyler

(10) Patent No.: US 11,464,141 B2
(45) Date of Patent: Oct. 4, 2022

(54) POWER CONVERTER DEVICE FOR A VEHICLE, AND VEHICLE

(71) Applicant: Valeo Siemens eAutomotive Germany GmbH, Erlangen (DE)

(72) Inventor: Christoph Hoyler, Kirchensittenbach (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 106 days.

(21) Appl. No.: 17/043,873

(22) PCT Filed: May 9, 2019

(86) PCT No.: PCT/EP2019/061928
§ 371 (c)(1),
(2) Date: Sep. 30, 2020

(87) PCT Pub. No.: WO2019/219500
PCT Pub. Date: Nov. 21, 2019

(65) Prior Publication Data
US 2021/0144887 A1 May 13, 2021

(30) Foreign Application Priority Data
May 15, 2018 (DE) .................... 10 2018 111 630.6

(51) Int. Cl.
H02M 7/00 (2006.01)
H05K 7/20 (2006.01)
H05K 7/14 (2006.01)

(52) U.S. Cl.
CPC ........ *H05K 7/20927* (2013.01); *H02M 7/003* (2013.01); *H05K 7/1432* (2013.01)

(58) Field of Classification Search
CPC .. H05K 7/20927; H05K 7/1432; H02M 7/003
See application file for complete search history.

(56) References Cited

U.S. PATENT DOCUMENTS

| 6,064,578 A * | 5/2000 | Hashimoto ........... H02M 7/003 363/16 |
| 9,826,665 B2 * | 11/2017 | Drofenik ............ H05K 7/20518 |
| 2008/0130223 A1 | 6/2008 | Nakamura et al. |
| 2010/0259898 A1 | 10/2010 | Kimura et al. |

(Continued)

FOREIGN PATENT DOCUMENTS

| DE | 102016204460 A1 | 9/2017 |
| EP | 3197035 A1 | 7/2017 |

OTHER PUBLICATIONS

PCT/ISA/210, "International Search Report for International Application No. PCT/EP2019/061928," dated Aug. 29, 2019.

(Continued)

*Primary Examiner* — Adolf D Berhane
*Assistant Examiner* — Afework S Demisse
(74) *Attorney, Agent, or Firm* — Manabu Kanesaka

(57) ABSTRACT

Power converter device for a vehicle, includes a cooling structure through which a cooling medium can flow and an intermediate circuit capacitor with a busbar arrangement. The busbar arrangement is thermally conductively connected to the cooling structure for the purpose of dissipating heat from the intermediate circuit capacitor at least in sections by means of a heat-conducting device.

13 Claims, 2 Drawing Sheets

(56) References Cited

U.S. PATENT DOCUMENTS

Figure 1:
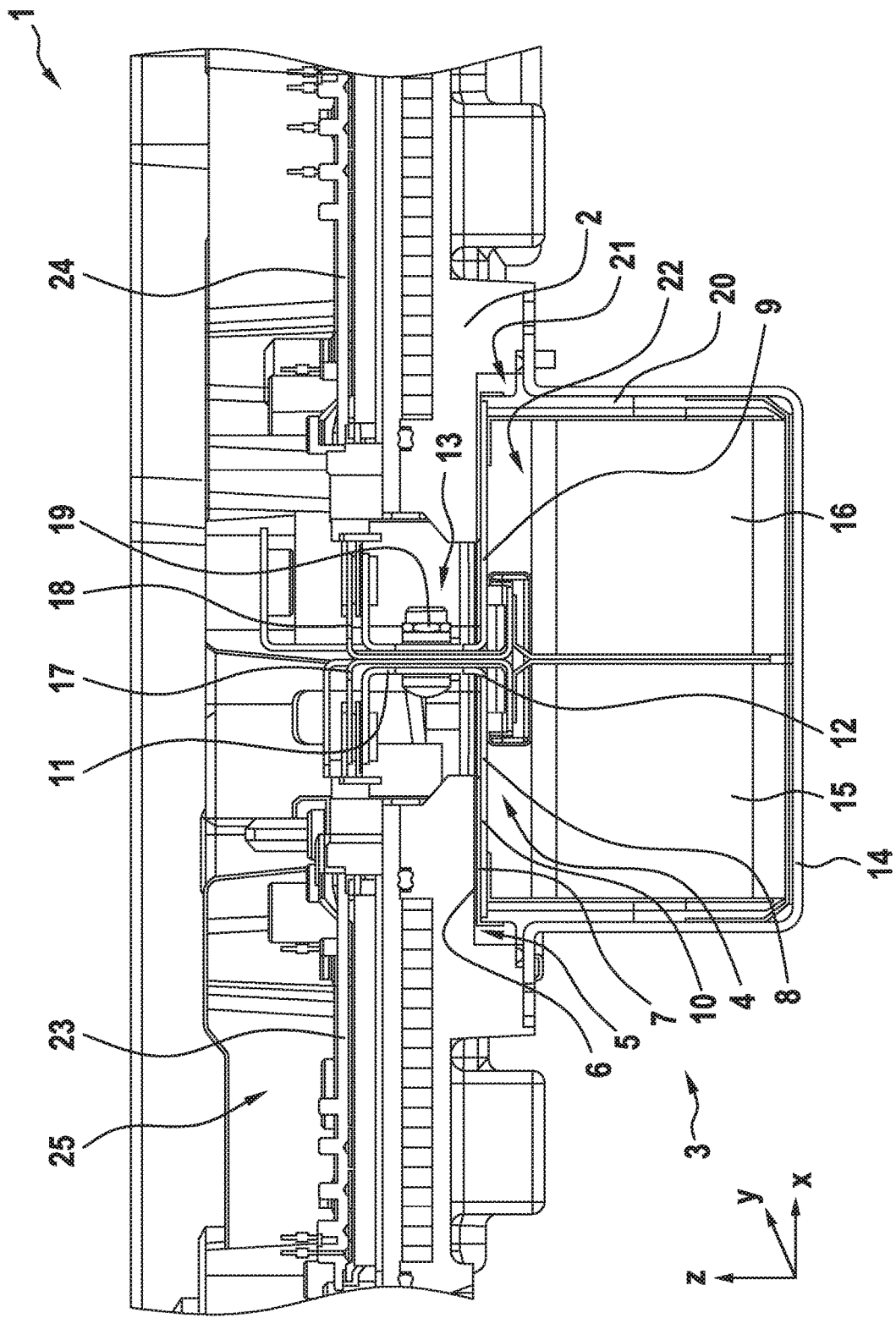

2012/0250384 A1   10/2012  Ito et al.
2016/0307822 A1   10/2016  Usui et al.
2018/0211938 A1*  7/2018  Tsuyuno ............. H01L 23/3677
2019/0245433 A1*  8/2019  Yan ...................... H05K 7/1427

OTHER PUBLICATIONS

PCT/ISA/237, "Written Opinion of the International Searching Authority for International Application No. PCT/EP2019/061928," dated Aug. 29, 2019.

* cited by examiner

POWER CONVERTER DEVICE FOR A VEHICLE, AND VEHICLE

RELATED APPLICATIONS

The present application is National Phase of International Application No. PCT/EP2019/061928 filed May 9, 2019, and claims priority from German Application No. 10 2018 111 630.6, filed May 15, 2018, the disclosure of which is hereby incorporated by reference herein in its entirety.

The present invention relates to a power converter device for a vehicle, comprising a cooling structure through which a cooling medium can flow and an intermediate circuit capacitor with a busbar arrangement. The invention also relates to a vehicle.

Such a power converter device for a vehicle is known from US 2012/0250384 A1, which discloses an inverter device with a plurality of switch components, a capacitor that smooths DC power, and a base plate. The plurality of switch components is placed on a component placement surface of the base plate, wherein heat dissipation fins are provided on the side of the base plate opposite the component placement surface. The capacitor has a capacitor component and capacitor bus bars potted in a housing area of the capacitor. The capacitor is cooled by airflow.

However, it is not possible to cool an intermediate circuit capacitor by means of airflow if the power converter device is encapsulated in the vehicle and protected from ambient influences. In addition, the heat dissipation behaviour of such a capacitor needs to be improved, since poor heat dissipation may lead to overheating at high power requirements and thus to thermal failure of the intermediate circuit capacitor.

The object of the invention is thus to describe an improved cooling of an intermediate circuit capacitor in a power converter device for a vehicle.

According to the invention, this object is achieved by a power converter device of the kind mentioned at the outset, wherein the busbar arrangement is thermally conductively connected to the cooling structure for the purpose of dissipating heat from the intermediate circuit capacitor at least in sections by means of a heat-conducting means.

The invention is based on the knowledge that conventional intermediate circuit capacitors have only a poor thermal connection to the cooling medium, although, especially in the case of potted intermediate circuit capacitors, additional thermal insulation is provided by the potting compound. The invention proposes, for this purpose, to thermally connect the busbar arrangement of the intermediate circuit capacitor to the cooling structure via the heat-conducting means in order to use the typically good thermal conductivity of the busbar arrangement for a dissipation of both heat generated by the current flow through the busbar arrangement and also of heat from the interior of the intermediate circuit capacitor.

It is therefore advantageous that the heat is conducted from the point where it is generated to the cooling structure via the heat-conducting means, instead of cooling the intermediate circuit capacitor only from the outside, as is the case with conventional power converter devices. This significantly improves the heat dissipation behaviour of the intermediate circuit capacitor and opens up the possibility for its use in high-power and high-temperature applications or extends its service life in such applications.

According to a first preferred embodiment of the power converter device according to the invention, the heat-conducting means is a heat-conducting paste by means of which the busbar arrangement is directly connected to the cooling structure. In this way, a particularly short heat transfer path between the busbar arrangement and the cooling structure can be realised, since only the heat-conducting paste serving as gap filler is used as heat-conducting means.

According to a second preferred embodiment, the heat-conducting means comprises a heat-conducting plate via which the busbar arrangement may be connected to the cooling structure. The heat-conducting plate may be used to advantageously bridge distances between the busbar arrangement and the cooling structure that are created as a result of the design. The heat-conducting plate is preferably made of metal. Of course, in this case too, the heat-conducting means may also include a heat-conducting paste, which is placed between the busbar arrangement and the heat-conducting plate and/or between the heat-conducting plate and the cooling structure.

In the case of the power converter device according to the invention, it may also be provided advantageously that the busbar arrangement has an insulating means by which the busbar arrangement is electrically insulated from the heat-conducting means. This allows sufficient electrical insulation, as is also the case with conventional potted busbar arrangements. The insulating means is preferably formed from an insulating foil.

The busbar arrangement may comprise at least one busbar element with a first busbar section extending in one spatial direction, on which the heat-conducting means is arranged, and a second busbar section extending in another spatial direction. The first busbar section may thus run parallel to a surface of the cooling structure to which the busbar arrangement is thermally connected. The second busbar section preferably extends perpendicularly to the first busbar section and is in particular in electrical contact with other components of the power converter device. Between the first busbar section and the second busbar section a, in particular curved, connecting section may be provided. Typically, the second busbar section and/or the connecting section do not touch the cooling structure and/or the heat-conducting structure. In addition, the cooling structure may have a through-opening into or through which the second busbar section extends.

In the case of the power converter device according to the invention, the intermediate circuit capacitor may have a housing and a capacitor structure which is accommodated at least in part in the housing and is electrically contacted with the busbar arrangement. The capacitor structure is formed, for example, from one or more windings, in particular foil windings.

Especially in the first preferred embodiment, the heat-conducting means and a section of the busbar arrangement connected to the heat-conducting means may be located outside the housing. In this case, the capacitor structure may protrude from the opening. The cooling structure then expediently has a recess into which the busbar arrangement and the capacitor structure protrude. In this case the capacitor structure may be potted. The mechanically advantageous properties of potted intermediate circuit capacitors, such as good electrical insulation and high resistance to climatic conditions, for example high humidity, can thus also be achieved with the power converter device according to the invention.

Especially with regard to the second preferred embodiment, the busbar arrangement and the capacitor structure and a section of the heat-conducting means not directly connected to the busbar arrangement may be potted in the housing. Preferably, the first busbar section is completely potted. In this case, the heat-conducting means may be substantially flush with an edge surface of the housing.

Preferably, the housing is attached to the cooling structure. This is achieved, for example, by means of a flange connection.

In addition, the power converter device according to the invention may have a power unit located on a side of the cooling structure opposite the housing. The cooling structure forms, in particular, a power converter housing which accommodates the power unit.

In addition, it may be provided in the case of the power converter device according to the invention that at least one cooling channel is provided in the cooling structure for a cooling fluid as cooling medium. The cooling fluid, in particular a cooling liquid, thus advantageously allows a particularly high level of heat dissipation. The at least one cooling channel may be part of a closed cooling circuit.

In addition, the invention relates to a vehicle, in particular an electric vehicle or hybrid vehicle, comprising an electric machine for driving the vehicle and a power converter device according to the invention for supplying the electric machine.

All embodiments of the power converter device according to the invention may be transferred analogously to the vehicle according to the invention, and therefore the above-mentioned advantages may also be achieved with the latter.

Figure 2:
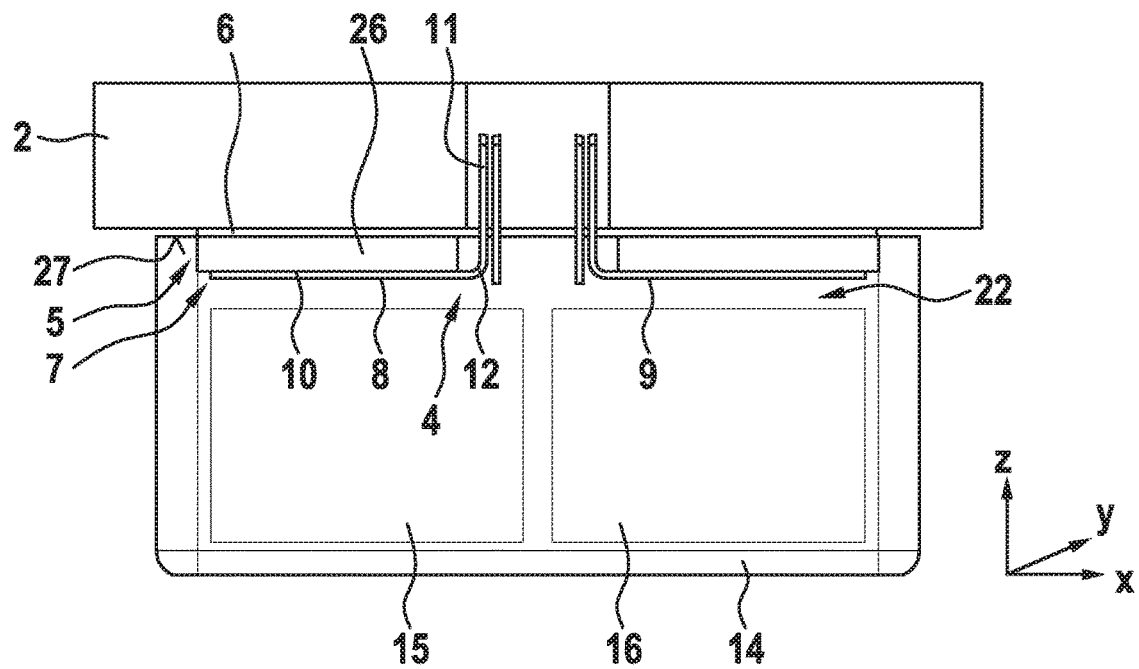
Figure 3:
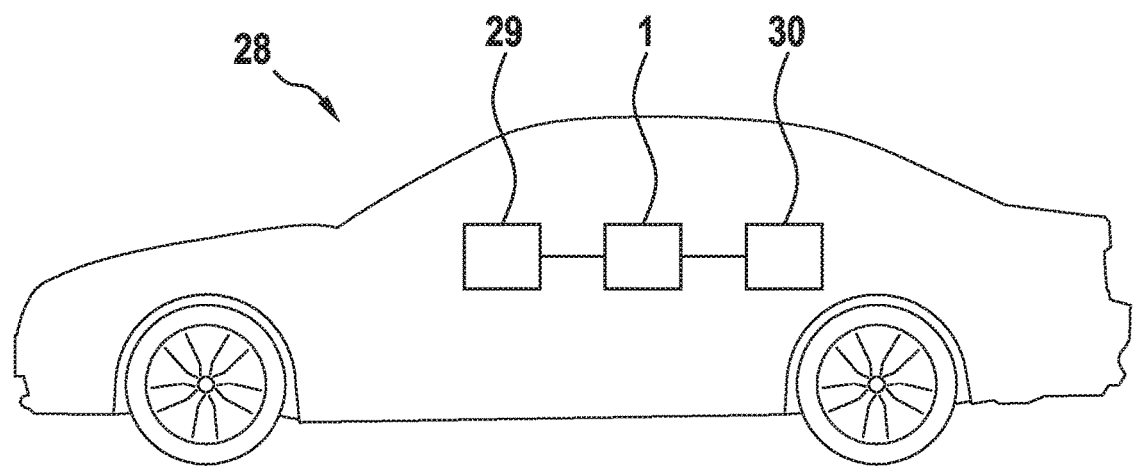

Further advantages and details of the present invention are shown in the drawings described below. These are schematic representations and show:

FIG. 1 a sectional view of a first embodiment of the power converter device according to the invention;

FIG. 2 a sectional view of a second embodiment of the power converter device according to the invention; and FIG. 3 a basic sketch of an embodiment of the vehicle according to the invention.

FIG. 1 is a sectional view of a first embodiment of a power converter device 1, comprising a cooling structure 2 through which a cooling medium can flow and an intermediate circuit capacitor 3 with a busbar arrangement 4, which is thermally conductively connected to the cooling structure 2 for the purpose of dissipating heat from the intermediate circuit capacitor 3 in sections by means of a heat-conducting means 5.

In the first embodiment, the heat-conducting means 5 is a heat-conducting paste 6, by means of which the busbar arrangement 4 is directly connected to the cooling structure. In addition, the busbar arrangement 4 has an insulating means 7 in the form of an insulating foil, by means of which the busbar arrangement 4 is electrically insulated from heat-conducting means 5.

The busbar arrangement 4 comprises two busbar elements 8, 9, each of which has a first busbar section 10 extending in a spatial direction x, a second busbar section 11 extending in a spatial direction z and a connecting section 12 of rounded shape connecting the busbar sections 10, 11. The heat-conducting means 5 is arranged flat on the first busbar section 10. Both therefore extend in an xy plane. The heat-conducting means lies directly on the insulating means 7. The second busbar section 11 touches neither the cooling structure 2 nor the heat-conducting means 5 and is guided through a through-opening 13 in the cooling structure 2.

The intermediate circuit capacitor 3 has a housing 14 and two capacitor structures 15, 16 in the form of film windings. The busbar elements 8, 9 make electrical contact with like poles of the capacitor structures 15, 16. In addition, the other poles of the capacitor structures 15, 16 are contacted by means of further busbar elements 17, 18 and are led between the busbar elements 8, 9 through the through-opening 13. The busbar elements 8, 17 on the one hand and the busbar elements 9, 18 on the other hand are insulated with respect to each other and fastened to each other by means of a screw connection 19.

Clearly, the capacitor structures 15, 16 protrude from the housing 14 or its opening, so that the busbar arrangement 4, the heat-conducting means 6 and the insulating means 7 are located outside the housing 14. Furthermore, a frame 20 is arranged in the housing 14 and also protrudes from the opening. A recess 21 is provided in the cooling structure 2, into which recess the capacitor structures 15, 16 and the frame 20 protrude. The volume delimited by the housing 14 and the frame 20 is filled with a potting compound 22, which also encloses sections in the first busbar section 10 lying perpendicular to the flat connection to the heat-conducting means 6 (here in an xz plane).

The power converter device 1 also has a power unit 25 comprising power switch element arrangements 23, 24 which is located on a side of the cooling structure 2 opposite the housing 14. In this respect, the cooling structure 2 also forms part of a power converter housing and is penetrated by a number of cooling channels (not shown), through which a cooling liquid flows as cooling medium. The cooling channels are part of a closed cooling circuit for cooling both the power unit 25 and the intermediate circuit capacitor 3.

FIG. 2 is a sectional view of a second embodiment of a power converter device 1, wherein only an area around the intermediate circuit capacitor 3 is shown and further parts of the power converter device 1 are designed as in the first embodiment.

The second embodiment differs from the first embodiment firstly in that the heat-conducting means 5 additionally comprises a heat-conducting plate 26 made of metal, with a layer of the heat-conducting paste 6 being arranged between the busbar arrangement 4 and the heat-conducting plate 26 and a layer of the heat-conducting paste 6 being arranged between the heat-conducting plate 26 and the cooling structure 2. Furthermore, the first busbar section 10, the connecting section 12, the insulating means 7 and the heat-conducting plate 26 are located inside the housing 14. An edge surface 27 of the opening of the housing 14 is flush with the heat-conducting plate 26. The frame 22 and the recess 21 are omitted. The volume delimited by the housing 14 is filled with the potting compound 22, which also encloses sections in the heat-conducting plate 26 perpendicular to the flat connection to the first busbar section 10 (here in the xz plane).

In all other respects, the comments relating to the first embodiment may be transferred to the second embodiment.

FIG. 3 is a basic sketch of an embodiment of a vehicle 28, comprising an electric machine 29 which is designed to drive the vehicle 28 and a power converter device 1 according to one of the previously described embodiments. The power converter device 1 is designed to electrically supply the electric machine 29, wherein, by means of the power converter device 1, a direct voltage provided by a high-voltage battery 30 may be converted into a multi-phase alternating voltage. Accordingly, the vehicle 28 is an electric vehicle or a hybrid vehicle.

The invention claimed is:

1. A power converter device for a vehicle, comprising:
a cooling structure through which a cooling medium can flow, and
an intermediate circuit capacitor with a busbar arrangement thermally conductively connected to the cooling structure for dissipating heat from the intermediate circuit capacitor at least partly by means of a heat-conducting means, wherein the heat-conducting means comprises a heat-conducting plate, through which the busbar arrangement is connected to the cooling structure, and a heat-conducting paste, which is arranged between the busbar arrangement and the heat-conducting plate.

2. The power converter device according to claim 1, wherein the heat-conducting paste is also arranged between the heat-conducting plate and the cooling structure.

3. The power converter device according to claim 1, wherein the busbar arrangement has an insulating means via which the busbar arrangement is electrically insulated from the heat-conducting means.

4. The power converter device according to claim 1, wherein the busbar arrangement comprises at least one busbar element with a first busbar section extending in one spatial direction, on which the heat-conducting means is arranged, and a second busbar section extending in another spatial direction.

5. The power converter device according to claim 4, wherein the cooling structure has a through opening into or through which the second busbar section extends.

6. The power converter device according to claim 1, wherein the intermediate circuit capacitor comprises a housing and at least one capacitor structure, which is received at least partly in the housing and is electrically contacted with the busbar arrangement.

7. The power converter device according to claim 6, wherein the heat-conducting means and a section of the busbar arrangement connected to the heat-conducting means are arranged outside the housing.

8. The power converter device according to claim 6, wherein the at least one capacitor structure is potted in the housing.

9. The power converter device according to claim 6, wherein the busbar arrangement and the at least one capacitor structure and a section of the heat-conducting means not directly connected to the busbar arrangement are potted in the housing.

10. The power converter device according to claim 6, wherein the housing is fixed to the cooling structure.

11. The power converter device according to claim 6, further comprising a power unit arranged on a side of the cooling structure opposite the housing.

12. The power converter device according to claim 1, wherein at least one cooling channel is formed in the cooling structure for a cooling fluid as cooling medium.

13. A vehicle comprising an electric machine for driving the vehicle and a power converter device according to claim 1 for supplying the electric machine.

* * * * *